US012757756B2

(12) United States Patent
Mohamed et al.

(10) Patent No.: US 12,757,756 B2
(45) Date of Patent: Oct. 6, 2026

(54) PACKAGE WITH LOW-WARPAGE CARRIER

(71) Applicant: Infineon Technologies AG, Neubiberg (DE)

(72) Inventors: Abdul Rahman Mohamed, Muar (MY); Shin Tieng Liew, Ipoh (MY); Chiong Yong Tay, Tangkak (MY); Lee Shuang Wang, Melaka (MY); Edmund Jr. Banogon Selorio, Melaka (MY); Ingrid Maus, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 385 days.

(21) Appl. No.: 18/390,772

(22) Filed: Dec. 20, 2023

(65) Prior Publication Data

US 2024/0222234 A1 Jul. 4, 2024

(30) Foreign Application Priority Data

Dec. 28, 2022 (DE) ..................... 10 2022 134 916.0

(51) Int. Cl.
*H10W 70/40* (2026.01)
*H10W 90/00* (2026.01)
(Continued)

(52) U.S. Cl.
CPC ......... *H10W 70/481* (2026.01); *H10W 90/00* (2026.01); *H10W 72/07332* (2026.01);
(Continued)

(58) Field of Classification Search
CPC ..... H10W 72/07332; H10W 72/07336; H10W 72/352; H10W 72/884; H10W 72/886;
(Continued)

(56) References Cited

U.S. PATENT DOCUMENTS

| | | | |
|---|---|---|---|
| 5,379,942 | A | 1/1995 | Kuhnert et al. |
| 2011/0215463 | A1 | 9/2011 | Lin et al. |

(Continued)

FOREIGN PATENT DOCUMENTS

| | | | |
|---|---|---|---|
| DE | 39 17 765 | A1 | 12/1990 |
| DE | 42 33 073 | A1 | 4/1994 |

(Continued)

*Primary Examiner* — Fernando L Toledo
*Assistant Examiner* — Adam S Bowen
(74) *Attorney, Agent, or Firm* — Dicke, Billig & Czaja, PLLC

(57) ABSTRACT

A method of manufacturing a package is disclosed. In one example, the method comprises providing a carrier with at least one component mounting region for mounting at least one electronic component. The carrier is pre-warped in accordance with an initial curvature direction. At least one electronic component is provided, the at least one electronic component comprises at least one first electrode on a first surface and at least one second electrode on a second surface, wherein the second surface is opposite to the first surface. The at least one electronic component is mounted with the second surface on the at least one component mounting region by a solder structure. Ambient conditions are applied to the carrier and to the at least one electronic component during mounting so that the carrier is re-warped to thereby at least partially reduce warpage of the carrier in a mounting plane.

20 Claims, 6 Drawing Sheets

(51) Int. Cl.
*H10W 72/00* (2026.01)
*H10W 72/30* (2026.01)

(52) U.S. Cl.
CPC .... *H10W 72/07336* (2026.01); *H10W 72/352* (2026.01); *H10W 72/884* (2026.01); *H10W 72/886* (2026.01); *H10W 90/736* (2026.01); *H10W 90/753* (2026.01); *H10W 90/756* (2026.01); *H10W 90/763* (2026.01); *H10W 90/766* (2026.01)

(58) Field of Classification Search
CPC ............. H10W 90/736; H10W 90/753; H10W 90/756; H10W 90/763; H10W 90/766
See application file for complete search history.

(56) References Cited

U.S. PATENT DOCUMENTS

| | | | | |
|---|---|---|---|---|
| 2019/0228962 | A1 | 7/2019 | Mizusawa | |
| 2022/0199562 | A1* | 6/2022 | Waidhas | H10W 70/60 |
| 2023/0066652 | A1* | 3/2023 | Gupta | H10W 42/121 |
| 2023/0298987 | A1* | 9/2023 | Leitgeb | H05K 3/4694 257/668 |

FOREIGN PATENT DOCUMENTS

| | | | |
|---|---|---|---|
| DE | 10 2005 061 773 | B3 | 5/2007 |
| JP | 2019016749 | A2 | 1/2019 |
| JP | 2020181965 | A2 | 11/2020 |
| KR | 20090120308 | A | 11/2009 |

* cited by examiner

PACKAGE WITH LOW-WARPAGE CARRIER

CROSS-REFERENCE TO RELATED APPLICATION

This Utility patent application claims priority to German Patent Application No. 10 2022 134 916.0 filed Dec. 28, 2022, which is incorporated herein by reference.

BACKGROUND

Technical Field

Various embodiments relate generally to a package, and a method of manufacturing a package.

Description of the Related Art

A conventional package may comprise an electronic component mounted on a chip carrier such as a leadframe, may be electrically connected by a bond wire extending from the chip to the chip carrier or to a lead, and may be optionally molded using a mold compound as an encapsulant.

Due to high warpage, reliability of a conventional package may be an issue.

SUMMARY

There may be a need for a package with high reliability.

According to an exemplary embodiment, a method of manufacturing a package is provided, wherein the method comprises providing a carrier with at least one component mounting region for mounting at least one electronic component, wherein the carrier is pre-warped in accordance with an initial curvature direction, providing the at least one electronic component, wherein the at least one electronic component comprises at least one first electrode on a first surface and at least one second electrode on a second surface, wherein the second surface is opposite to the first surface, mounting the at least one electronic component with the second surface on the at least one component mounting region by a solder structure, and applying ambient conditions to the carrier and to the at least one electronic component during mounting so that the carrier (and optionally also the least one electronic component) is re-warped to thereby at least partially reduce warpage of the carrier in a mounting plane.

According to another exemplary embodiment, a package is provided which comprises a carrier comprising a first component mounting region and a second component mounting region with a slot in between, at least one first electronic component mounted on the first component mounting region, and at least one second electronic component mounted on the second component mounting region, wherein warpage of the carrier in a mounting plane is less than 50 μm.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
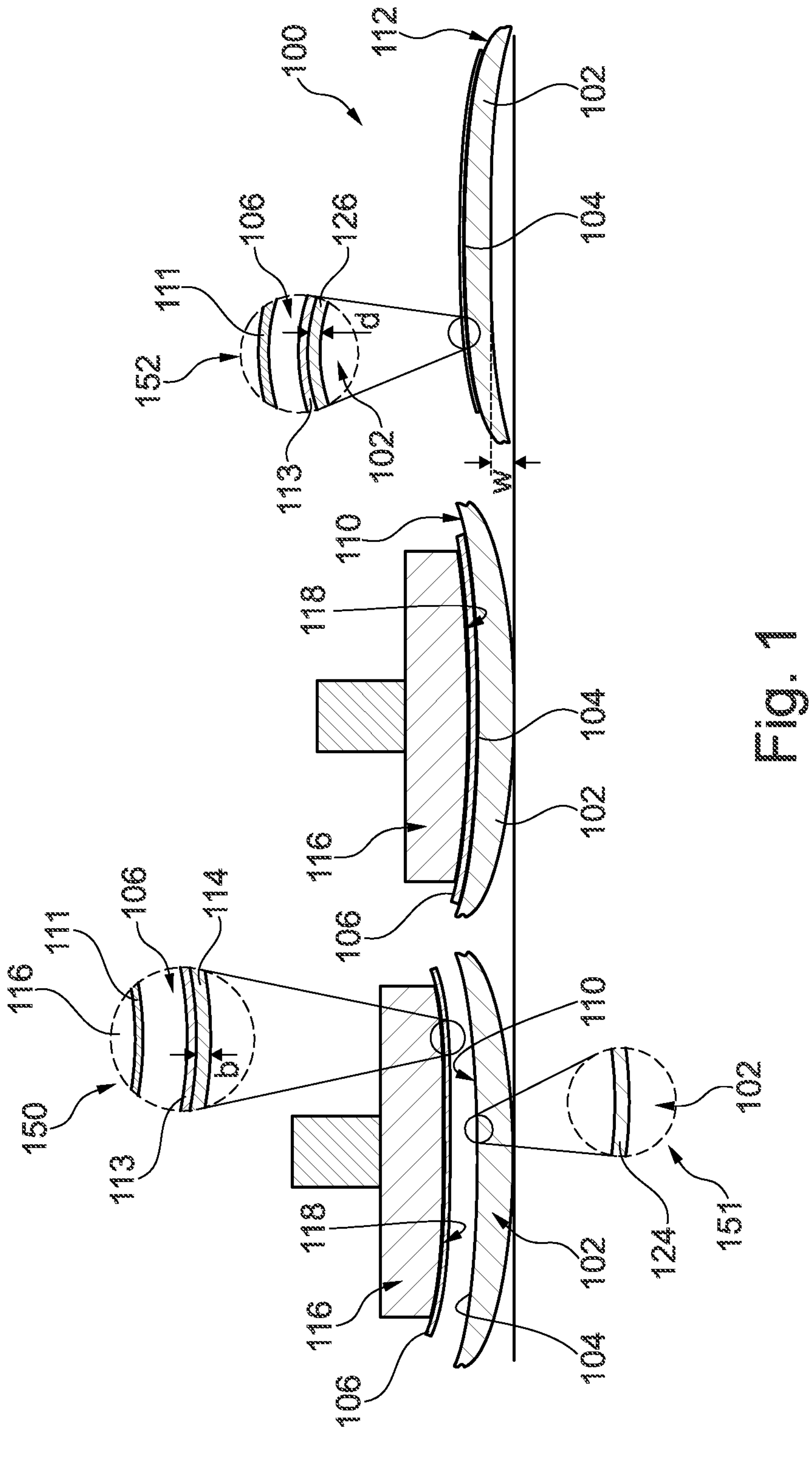
FIG. 1 illustrates cross-sectional views of structures obtained during manufacturing a package according to an exemplary embodiment.

There may be a need for a package with high reliability.

According to an exemplary embodiment, a method of manufacturing a package is provided, wherein the method comprises providing a carrier with at least one component mounting region for mounting at least one electronic component, wherein the carrier is pre-warped in accordance with an initial curvature direction, providing the at least one electronic component, wherein the at least one electronic component comprises at least one first electrode on a first surface and at least one second electrode on a second surface, wherein the second surface is opposite to the first surface, mounting the at least one electronic component with the second surface on the at least one component mounting region by a solder structure, and applying ambient conditions to the carrier and to the at least one electronic component during mounting so that the carrier (and optionally also the least one electronic component) is re-warped to thereby at least partially reduce warpage of the carrier in a mounting plane.

According to another exemplary embodiment, a package is provided which comprises a carrier comprising a first component mounting region and a second component mounting region with a slot in between, at least one first electronic component mounted on the first component mounting region, and at least one second electronic component mounted on the second component mounting region, wherein warpage of the carrier in a mounting plane is less than 50 μm.

According to an exemplary embodiment, a package is manufactured by providing a carrier with well-defined pre-warpage on which an electronic component having electrodes on both opposing main surfaces is mounted. This mounting process may be accomplished by soldering, which may expose the carrier and the electronic component to high temperature. As a consequence of the soldering and a subsequent cooling process, the carrier may be re-warped due to stress applied to carrier and electronic component during the mentioned process. To put it shortly, re-warping may correspond to a re-shaping of the carrier with mounted electronic component(s) by post-solder cooling. In particular, said stress may be at least partially created by a mismatch between coefficients of thermal expansion of the electronic component material (for instance a semiconductor material, such as silicon) and carrier material (for example a metallic material, such as copper). Advantageously, the re-warping of the carrier due to the described phenomena may be inverse to and may thereby weaken the pre-warping of the carrier prior to the soldering. Hence, the initial warpage may be at least partially compensated, which may lead to a reduced net warpage at the end of the solder process. As a result, a package with low warpage may be obtained which may lead to a high reliability.

According to another exemplary embodiment, a package may be provided having electronic components mounted on multiple component mounting regions of a carrier with a slot between adjacent electronic components or between adjacent groups of electronic components. Advantageously, such a package may be provided with an extremely small warpage of less than 50 μm in a mounting plane due to the execution of the above described manufacturing method. This may be the result of a proper management of the coefficient of thermal expansion (CTE) mismatch between carrier and electronic components in combination with a related warpage management, as described herein.

Description of Further Exemplary Embodiments

In the following, further exemplary embodiments of the package and the method will be explained.

In the context of the present application, the term "package" may particularly denote an electronic device which may comprise one or more electronic components mounted on a (in particular electrically conductive) carrier. Said constituents of the package may be optionally encapsulated at least partially by an encapsulant. Optionally, one or more electrically conductive interconnect bodies (such as metallic pillars, bumps, bond wires and/or clips) may be implemented in a package, for instance for electrically coupling and/or mechanically supporting the electronic component.

In the context of the present application, the term "carrier" may particularly denote a support structure (which may be at least partially electrically conductive) which serves as a mechanical support for the electronic component(s) to be mounted thereon, and which may also contribute to the electric interconnection between the electronic component(s) and the periphery of the package. In other words, the carrier may fulfil a mechanical support function and an electric connection function. A carrier may comprise or consist of a single part, multiple parts joined via encapsulation or other package components, or a subassembly of carriers. When the carrier forms part of a leadframe, it may be or may comprise a die pad. For instance, such a carrier may be a leadframe structure (for instance made of copper), a DAB (Direct Aluminum Bonding) substrate, a DCB (Direct Copper Bonding) substrate, etc. Moreover, the carrier may also be configured as Active Metal Brazing (AMB) substrate. Also at least part of the carrier may be encapsulated by an encapsulant, together with the electronic component.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). However, in other embodiments, the electronic component may also be of different type, such as a mechatronic member, in particular a mechanical switch, etc. In particular, the electronic component may be a semiconductor chip having at least one integrated circuit element (such as a diode or a transistor in a surface portion thereof. The electronic component may be a bare die or may be already packaged or encapsulated. Semiconductor chips implemented according to exemplary embodiments may be formed in silicon technology, gallium nitride technology, silicon carbide technology, etc.

In the context of the present application, the term "component mounting region" may particularly denote a surface region of the carrier which is provided for mounting an electronic component thereon. During the mounting process, the component mounting region may form part of an upper main surface of the carrier. It is also possible that a plurality of component mounting regions are foreseen at one carrier, preferably on the same main surface thereof.

In the context of the present application, the term "pre-warped carrier" may particularly denote a carrier which has undergone a processing (such as a pre-solder treatment) leading to a defined bending of the carrier. Thus, it is for example possible that the pre-warped carrier has been treated by bending. The pre-warping of the carrier may be for example entirely concave on its main surface comprising at least one component mounting region.

In the context of the present application, the term "initial curvature direction" may particularly denote that a curving of the carrier at least on a main surface on which the one or more electronic components are to be mounted, is of a predefined type, such as of a concave type, prior to assembling one or more electronic components to the carrier. A final curvature direction of the carrier, which may be obtained after applying ambient conditions for re-warping during soldering including post-solder cooling, may be identical to the initial curvature direction or may be inverse to the initial curvature direction.

In the context of the present application, the term "electrode" may particularly denote an electrically conductive surface portion which is provided for establishing electric connection of the electronic component with an electronic periphery, in particular with the carrier. For instance, such an electrode may be a pad.

In the context of the present application, the term "solder structure" may be a solderable material which can be subjected to soldering to thereby establish an electrically conductive solder connection between an electrode of the electronic component and the carrier. For instance, such a solder structure may be a film or layer of solder or may be a solder bump. For example, the solder structure may comprise tin.

In the context of the present application, the term "applying ambient conditions so that the carrier is re-warped to thereby at least partially reduce warpage of the carrier in the mounting plane" may particularly denote that the soldering process including post-solder cooling is carried out with ambient conditions, such as temperature, pressure and/or a surrounding milieu, which may lead inevitably to a re-warping of the carrier with the at least one electronic component soldered thereon. In particular, elevated temperature during soldering in combination with subsequent cooling may create compressive stress which may force the carrier to change its warpage characteristics. For instance, a temperature profile applied during and after soldering may reduce warpage in the initial curvature direction, or may convert the type of warpage from warpage in the initial curvature direction to smaller warpage in an inverse final curvature direction, or may even entirely reduce warpage at all. The applied ambient conditions in combination with the material properties of electronic component and carrier (in particular a CTE mismatch between electronic component(s) and carrier) may then lead to the warpage reducing re-warping.

In the context of the present application, the term "warpage in a mounting plane" may particularly denote a quantitative deviation of a for example substantially flat, planar or plate-shaped carrier from an entirely flat, planar or plate-shaped configuration in a plane on which the carrier is arranged or in which the carrier is mounted on a mounting base (such as a printed circuit board). Such a warpage in a mounting plane may be caused by bending of the carrier due to stress. The mounting plane may be a horizontal plane. In particular, the mounting plane may be the plane on which the carrier rests. In particular, warpage in the mounting plane may be a spatial (for example vertical) range between a minimum position of a carrier's main surface (for example a lowermost bottom position of the carrier, for instance at a lateral end of the carrier) and a maximum position of the carrier's main surface (for example an uppermost bottom position of the carrier, for instance in a central portion of the carrier).

In the context of the present application, the term "slot" may in particular denote a lengthy narrow through hole or opening in the carrier. For example, a slot may be straight. For example, a ratio between a length and a width of the slot may be at least 2, in particular at least 3, for example at least 4.

In an embodiment, the method comprises applying the ambient conditions to re-warp the carrier during mounting so that the warpage of the carrier in the mounting plane is less than 50 μm, in particular is in a range from 10 μm to 20 μm. Such a small value of warpage in a mounting plane has not been achievable with conventional approaches.

In an embodiment, the method comprises applying the ambient conditions so that the carrier is re-warped from the initial curvature direction into an inverse final curvature direction. In such an embodiment, it is for instance possible that the preferably plate-shaped carrier is converted from an initial curvature direction according to which the at least one electronic component is mounted on a concave component mounting region into a final curvature direction which has the inverse curvature, i.e. a convex main surface having the one or more component mounting regions in the given example. Thus, the carrier may be shaped and treated by applied ambient conditions during the mounting process so that the type of curvature of the carrier is inverted into its opposite. The net warpage or absolute value of the warpage may however be reduced by this inversion. This has turned out as a highly efficient mechanism for partially compensating warpage during cooling subsequent to a solder process.

In another embodiment, the method comprises applying the ambient conditions so that the carrier is re-warped to reduced warpage in the initial curvature direction. For instance, the described embodiment may refer to a scenario in which the main surface of the carrier having the at least one component mounting surface is initially concave (or convex) and will have a reduced concave (or convex) curvature after cooling down following the soldering process. Thus, the initial curvature direction may be maintained, but the net warpage may be reduced.

In still another embodiment, the method comprises applying the ambient conditions so that the carrier is re-warped from the initial curvature direction into a warpage-free shape. In such an embodiment, the pre-warping of the carrier is adjusted so that the re-warping exactly compensates the pre-warping. This may lead to a package with a completely flat carrier.

In an embodiment, the solder structure comprises at least one of the group of AuSn, NiSn and/or CuSn, and InSn. The described solder materials are particularly appropriate for soldering electronic components on carriers, in particular by diffusion soldering. However, other materials are possible.

In an embodiment, the solder structure is disposed on the second electrode on the second surface of the at least one electronic component. Thus, the chip pad to be connected to the carrier by soldering may carry the solder structure. Additionally or alternatively, a solder structure may be applied on a component mounting region of the carrier.

In an embodiment, a thickness of the solder structure is in a range from 1 μm to 10 μm, in particular in a range from 3 μm to 5 μm. Thus, a very tiny solder structure may be implemented which may lead to a compact design of the manufactured package. Even if a corresponding solder process creates warpage, this may be compensated at least partially by the above-described pre-warping of the carrier.

In an embodiment, the method comprises mounting the at least one electronic component on the at least one component mounting region by diffusion soldering. By diffusion soldering, the carrier and the electronic component may be connected by a diffusion of material between the interconnected structures. Such a diffusion may be triggered in particular by supplying heat to the carrier and electronic component in (for example pressurized) contact with each other, and to the solder structure in between.

In an embodiment, the initial curvature direction corresponds to a concave mounting surface of the at least one component mounting region on which mounting surface the at least one electronic component is mounted. In such a preferred embodiment, the plate-shaped carrier may be bent so as to have a completely concave or at least partially concave main surface facing the one or more electronic components to be mounted thereon. By compressive stress due to diffusion soldering and subsequent cooling under consideration of the CTE mismatch between the electronic component and the carrier, a significant reduction of warpage may be achieved due to re-warping.

In an embodiment, the applied ambient conditions comprise an elevated temperature followed by cooling down. Providing the elevated temperature may be accomplished by supplying heat to the carrier and the electronic component, for instance in a heating chamber and/or by irradiation with corresponding electromagnetic radiation.

In an embodiment, the elevated temperature is in a range from 300° C. to 400° C., in particular is in a range from 320° C. to 380° C., more particularly is in a range from 340° C. to 360° C. Thus, extremely high soldering temperatures may be possible thanks to the re-warping process leading, in combination with an initial pre-warping of the carrier, to a package with very small warpage of the carrier. Hence, a highly reliable solder connection may be combined with a low warpage.

In an embodiment, the applied ambient conditions comprise a connection pressure for connecting the at least one electronic component with the at least one component mounting region followed by releasing said connection pressure. For triggering soldering between the carrier and the electronic component supported by the solder structure in between, the application of pressure may be preferred. In particular, high pressure in combination with high temperature may lead to a fast and reliable soldering process.

In an embodiment, the connection pressure is at least 1 $N/mm^2$, in particular at least 3 $N/mm^2$. Hence, an extremely large connection pressure may be applied between electronic component and carrier.

In an embodiment, the method comprises mounting the at least one electronic component on the at least one component mounting region by pressing the at least one electronic component by a bond tool (such as a collet) onto the at least one component mounting region, wherein in particular a surface of the bond tool pressing the at least one electronic component on the at least one component mounting region is curved in accordance with a bond tool curvature direction being inverse to the initial curvature direction of the carrier. Thus, pressing a bond tool onto the electronic component and the latter onto the carrier may lead to a precisely defined mounting process and therefore to a reliable package. Particularly preferred may be that a contact surface of the bond tool to the electronic component may have a curvature of a type being inverse to the initial curvature direction of the main surface of the carrier comprising the at least one component mounting region. For instance, when the latter mentioned main surface of the carrier has a concave curvature, the contact surface of the bond tool may have a convex surface, or vice versa.

In an embodiment, the method comprises mounting at least one further electronic component on the at least one component mounting region. Thus, a plurality of electronic components may be mounted side by side on the same main surface of the carrier, for example on different component mounting regions thereof. For instance, at least two, in particular at least four, more particularly at least eight, electronic components may be mounted on one carrier. This may allow to realize even complex or sophisticated electronic functionality while achieving a low warpage package.

In an embodiment, the warpage of the carrier in the mounting plane is less than 15 μm, in particular less than 10 μm. Since the described manufacturing method allows for a reliable at least partial compensation of a pre-warping by a warpage reducing re-warping, even the mentioned very small warpage values may be realized.

In an embodiment, the carrier comprises a leadframe structure. A leadframe may be a patterned or punched, and optionally bent, metallic structure. A leadframe may for instance be made of copper and/or aluminum. It is possible that a metallic plate of a leadframe is covered with a surface layer, for instance a plated layer or a layer of solderable material. A leadframe may comprise a die pad comprising the above-mentioned at least one component mounting region and being configured for accommodating at least one electronic component, such as a semiconductor die.

In an embodiment, the carrier comprises a plurality of lead structures, in particular electrically coupled with at least one of the at least one first electronic component, the at least one second electronic component, the first component mounting region and the second component mounting region. Hence, a leadframe may comprise one or a plurality of lead structures providing an electric contact for an electronic periphery coupled with the leadframe and the at least one electronic component mounted thereon. For example, an electrically conductive connection element, such as a bond wire or a clip, may interconnect an electrode on top of the mounted electronic component with a respective lead structure. Furthermore, another lead structure may be electrically coupled with a die pad on which an electrode on a lower main surface of the electronic component may be connected.

In an embodiment, at least part of a surface of the carrier is covered with a plating structure, in particular at least one of the group consisting of nickel, silver, and NiNiP. A plating structure on a surface of the carrier may protect the carrier against oxidation and migration of material. Thus, such a plating structure may also contribute to a high reliability.

In an embodiment, a thickness of at least one of the first component mounting region and the second component mounting region is in a range from 0.2 mm to 1.5 mm, in particular is in a range from 0.5 mm to 0.9 mm. If a carrier in the mentioned thickness ranges needs to carry one or preferably a plurality of electronic components, such a structure may be in principle prone to warpage. Thus, in view of the above-described concept of pre-warping the carrier prior to a mounting process, a subsequent re-warping of the carrier by correspondingly adjusting ambient conditions during soldering may be of utmost advantage.

In an embodiment, the package comprises a connection structure in form of an intermetallic compound, in particular at least one of the group of AuSnCu, AuSnNi, AuSnAg, NiSn and CuSn, connecting the carrier with at least one of the at least one first electronic component and the at least one second electronic component. Such an intermetallic compound between carrier and electronic component may be created by diffusion soldering and may establish a high connection strength.

In an embodiment, the connection structure has a thickness in a range from 1 μm to 10 μm, in particular less than 5 μm. Despite of its small thickness, the reliability of the mechanical and electric connection provided by such a connection structure may be excellent.

In an embodiment, the package is configured as power package. A power package may be a package comprising at least one power chip as electronic component. Thus, the package may be configured as power module, for instance molded power module such as a semiconductor power package. For instance, an exemplary embodiment of the package may be an intelligent power module (IPM). Another exemplary embodiment of the package is a dual inline package (DIP).

Correspondingly, the electronic component may be configured as a power semiconductor chip. Thus, the electronic component (such as a semiconductor chip) may be used for power applications for instance in the automotive field and may for example have at least one integrated insulated-gate bipolar transistor (IGBT) and/or at least one transistor of another type (such as a MOSFET, a JFET, a HEMT, etc.) and/or at least one integrated diode. Such integrated circuit elements may be manufactured for instance in silicon technology or based on wide-bandgap semiconductors (such as silicon carbide, gallium nitride). A semiconductor power chip may comprise one or more field effect transistors, diodes, inverter circuits, half-bridges, full-bridges, drivers, logic circuits, further devices, etc. Advantages of exemplary embodiments concerning isolation and thermal dissipation are particularly pronounced for power dies.

In an embodiment, the package comprises an encapsulant encapsulating at least part of the carrier and at least part of the electronic component. In the context of the present application, the term "encapsulant" may particularly denote a substantially electrically insulating material surrounding at least part of an electronic component and at least part of a carrier to provide mechanical protection, electrical insulation, and optionally a contribution to heat removal during operation. In particular, said encapsulant may be a mold compound. A mold compound may comprise a matrix of flowable and hardenable material and filler particles embedded therein. For instance, filler particles may be used to adjust the properties of the mold component, in particular to enhance thermal conductivity. As an alternative to a mold compound (for example on the basis of epoxy resin), the encapsulant may also be a potting compound (for instance on the basis of a silicone gel).

In an embodiment, the package comprises a heat sink which may be mounted on an exterior side of the carrier. Such a heat sink may be a heat dissipation body, which may be made of a highly thermally conductive material such as copper or aluminum. For instance, such a heat sink may have a base body being directly connected to said surface of the encapsulant and may have a plurality of cooling fins extending from the base body and in parallel to each another so as to remove the heat towards the environment.

In an embodiment, the package comprises an electrically conductive coupling element electrically coupling the electronic component with the carrier and/or with at least one lead structure. Such an electrically conductive coupling element may be a clip, a bond wire or a bond ribbon. A clip may be a curved electrically conductive body accomplishing an electric connection with a high connection area to an upper main surface of a respective electronic component. Additionally or alternatively to such a clip, it is also possible to implement one or more other electrically conductive interconnect bodies in the package, for instance a bond wire and/or a bond ribbon connecting the electronic component with the carrier and/or a lead structure.

In an embodiment, the package is configured as one of the group consisting of a leadframe connected power module, a Control integrated power system (CIPOS) package, a Transistor Outline (TO) package, a Quad Flat No Leads Package (QFN) package, a Small Outline (SO) package, a Small Outline Transistor (SOT) package, and a Thin Small Outline Package (TSOP) package.

As substrate or wafer forming the basis of the electronic components, a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

Conventional packages may suffer from high warpage. To overcome high package warpage, a large package size may be used that may lead to high thermal resistance in view of air gaps underneath a heat sink. According to a current mitigation of such shortcomings, a user may change a printed circuit board (PCB) stencil printing design to compensate the warpage. This is however cumbersome.

Hence, disadvantages of conventional approaches are back end processes leading to a bouncing issue during a wire bond process. Furthermore, a user of a package may have to do hardware changes, which may be cumbersome for the user.

In an incoming bare leadframe profile, die pads may have a concave profile, typically with a profile height of for example 7 μm to 19 μm. The back of the heat sink may have a concave profile with a profile height of 10 μm to 16 μm. A concave collet may be used to perform diffusion die bonding on a concave die pad. However, due to thermomechanical stress after diffusion solder die attach, further die pad warpage may be added.

According to an exemplary embodiment, a package manufacturing architecture is provided which is based on a carrier with component mounting region for mounting an electronic component. Advantageously, the carrier is pre-warped in accordance with an initial curvature direction, which may be for example a concave bending provided on the component mounting side. The electronic component may be of a type having electrodes on both opposing main surfaces thereof and may be mounted on the component mounting region by soldering. Advantageously, ambient conditions may be applied to the carrier and the electronic component during the mounting process (i.e. during soldering including subsequent cooling) so that the carrier is re-warped as a consequence of said ambient conditions. The combination of pre-warping in accordance with a dedicated initial curvature direction and the application of predefined ambient conditions during the mounting process leading to re-warping may allow to reduce warpage of the carrier in the mounting plane. Preferably, said warpage may be lowered to 50 μm or less. Consequently, a package with high reliability and high performance may be obtained.

According to an exemplary embodiment, warpage of a package comprising one or preferably a plurality of electronic components on a carrier may be reduced. This may be achieved by pre-warping the carrier to at least partially compensate an anticipated warping in the opposite direction caused by a soldering process. The latter may lead to an amount of warping due to heating and subsequent cooling of carrier and electronic component as well as the solder structure in between during the soldering process, in particular during a diffusion soldering process. When the pre-warping is adjusted to counteract the warpage added by the soldering process, the overall, net or final warpage may be strongly reduced compared with conventional approaches.

More specifically, a leadframe-type carrier may be provided with an initially concave bend. During a die attach process the warpage direction may change to a convex bend at cooling. In such a scenario, the concave bend (created by pre-warping) may be done to reduce warpage in the other direction after a die attach process.

In one embodiment, the leadframe-type carrier may carry at least two (preferably thin) dies, which may cover more than half of the die paddle. As, a convex shaped die may be attached to a concave shaped leadframe-type carrier using a convex die bond tool, such as a collet. Advantageously, a compressive stress from diffusion soldering may bend the concave carrier to a concave shape after die bonding.

A package according to an exemplary embodiment may have a size of or above 15 mm×15 mm. For example, such a package may be of QDPAK type. A solder structure used for connecting carrier with electronic component(s) may have a thickness of less than 5 μm. For example, the solder structure connecting carrier with electronic component may form an intermetallic component, for example on the basis of AuSnCu, NiSn, CuSn, etc. This may lead to a heatsink profile of less than 50 μm. A leadframe die pad of a carrier may have a thickness of 900 μm or below.

An exemplary embodiment may have the advantage of providing direct die to leadframe bonding without any spacer or thermo-mechanical stress buffer material. A boundary region may be created between a top coining and a flat region.

In one embodiment, it may be possible to apply a bent leadframe with at least two dies that may have a geometrically bigger size and which may be thinner than a leadframe-type carrier on which the dies or other electronic components are mounted. All dies may have a very thin bond line thickness (BLT), preferably below 10 μm. For example, more than 60% of a die paddle may be covered by the assigned die. The bend shape of the die attach side of the carrier may be initially in concave profile prior to the die attach process, and may change to a convex profile during a post-die attach cooling process. Triggered by soldering, a reverse leadframe coining from bottom-up to top-down may be obtained. Correspondingly, a die bond tool may be configured with a convex profile to match with a die pad surface profile. Advantageously, a diffusion soldering compressive stress generated after die bond may bend down a convex die pad to a concave shape (or vice versa) with acceptable radius of curvature (ROC).

Packages according to exemplary embodiments may be manufactured with leadframe sizes of at least 15 mm×15 mm. Examples are dimensions of 34 mm×36 mm or 37 mm×47 mm.

For example, a leadframe thickness may be in a range from 500 μm to 900 μm, in particular what concerns a die pad thereof.

For instance, plating of a leadframe (preferably made of copper) may be done with NiNiP, Ni, and/or Ag.

As die attach material, it is for example possible to use AuSn, NiSn, and/or CuSn with a thin BLT having a thickness below 5 μm.

A final intermetallic compound (IMC) may be for example AuSnCu or AuSnNi, AuSnAg, NiSn, CuSn.

A region for top coining (to provide a convex curvature) may be an edge having a distance to a die pad edge.

For instance, a die attach temperature may be larger than 340° C., preferably in combination with a high bond pressure (for example larger than 2.2 $N/mm^2$).

Packages according to exemplary embodiments may be configured as single or multichip devices.

FIG. 1 illustrates cross-sectional views of structures obtained during manufacturing a package 100 according to an exemplary embodiment.

Referring to the left-hand side of FIG. 1, a carrier 102, which may be embodied as metal plate or leadframe structure, is provided with a component mounting region 104. The latter is foreseen for mounting an electronic component 106 thereon. The electronic component 106 which is to be mounted on the component mounting region 104 can be a semiconductor chip, in particular power semiconductor chip. Although not shown in FIG. 1, it is also possible to provide multiple component mounting regions for mounting multiple electronic components on the carrier 102. Still referring to the left-hand side of FIG. 1, the carrier 102 is pre-warped in accordance with an initial curvature direction 110. Pre-warping of carrier 102 may be accomplished by bending the plate-shaped carrier 102 with a predefined amount in a predefined direction which defines the initial curvature direction 110. In the embodiment shown on the left-hand side of FIG. 1, the initial curvature direction 110 pre-warps the carrier 102 so that the component mounting region 104 on the top side of the carrier 102 is concave. Correspondingly, the bottom side of the carrier 102 facing away from the electronic component 106 after its assembly to the carrier 102, is convex according to the left-hand side of FIG. 1.

Still referring to the left-hand side of FIG. 1, the provided electronic component 106 comprises at least one first electrode 111 on an upper first surface and at least one second electrode 113 on a lower second surface opposite to the first surface. For example, the electronic component 106 may be a field effect transistor chip having a source terminal, a drain terminal and a gate terminal as the mentioned electrodes. In this embodiment, the electronic component 106 may be a device with vertical current flow, i.e. a current flow in the vertical direction according to FIG. 1 during operation. According to the left-hand side of FIG. 1, the electronic component 106 is attached to a bond tool 116, for instance a collet, used as a mounting aid. For example, the bond tool 116 may pick a die-type electronic component 106 from a wafer and may place the electronic component 106 on leadframe-type carrier 102. As shown, a surface of the bond tool 116 is curved in accordance with a bond tool curvature direction 118 being inverse to the initial curvature direction 110 of the side of the carrier 102 facing the bond tool 116. Thus, a mounting surface of the bond tool 116 is convex in the shown embodiment.

The left-hand side of FIG. 1 shows carrier 102 prior to a process of mounting electronic component 106 thereon. As shown, the carrier 102 which is here embodied as a bent metallic plate such as a leadframe structure, has a concave upper main surface and a convex lower main surface. While the convex lower main surface may rest on a base structure, the concave upper main surface may comprise component mounting region 104. Electronic component 106, which is here embodied as a semiconductor die, is arranged on a convex connection surface of the bond tool 116. During a component mounting process, the bond tool 116 with attached electronic component 106 may be moved downwardly so that the electronic component 106 is contacted with or is even pressed onto the component mounting region 104.

As shown on the left-hand side of FIG. 1, and in particular in a detail 150, a solder structure 114 is formed as a thin film on the lower main surface of the electronic component 106, in particular on second electrode 113. Furthermore, as shown in a detail 151, the upper main surface of the carrier 102 and therefore also the component mounting region 104 may be provided with a plating structure 124. Optional plating structure 124 may be directly plated onto the die pad or carrier 102 and may be a surface finish, such as silver. The remaining material of the carrier 102 (and if no plating structure 124 is provided the entire material of the carrier 102) may be a metal such as copper. Details 150, 151 show that solder material is only applied on the side of the electronic component 106, but not on the side of the carrier 102.

As shown in the central image of FIG. 1, the electronic component 106 is mounted on the component mounting region 104 by pressing the electronic component 106 mounted on bond tool 116 onto the component mounting region 104 by pressing bond tool 116 with electronic component 106 in between onto the initially concave surface of the carrier 102. As already mentioned, the surface of the bond tool 116 pressing the electronic component 106 on the component mounting region 104 is curved in accordance with a bond tool curvature direction 118 being inverse to the initial curvature direction 110 of the carrier 102. More precisely, the electronic component 106 is connected at its second surface on the component mounting region 104 by diffusion soldering using solder structure 114. For example, the solder structure 114 comprises a tin alloy such as AuSn. A thickness, b, of the solder structure 114 may be in a range from 3 μm to 5 μm, i.e. may be very thin. The layer-type solder structure 114 is shown in a detail 150. Before connection, the solder structure 114 is disposed on the second electrode 113 on the second surface of the electronic component 106.

Still referring to the image in the center of FIG. 1, the bond tool 116 with attached electronic component 106 has reached the component mounting surface 104 of the carrier 102 and thereby presses the electronic component 106 onto the component mounting surface 104 of the carrier 102. This connection process may be supported by supplying heat, so that pressure and a high temperature are applied to the carrier 102 and the electronic component 106 to be connected therewith simultaneously. By taking this measure, a diffusion solder process is executed connecting the carrier 102 to the electronic component 106 by solder structure 114. This may include the formation of an intermetallic compound (see reference sign 126 on the right-hand side of FIG. 1) between carrier 102 and second electrode 113 of electronic component 106 leading to a high connection strength. After completing this manufacturing process, the bond tool 116 may be removed, thereby releasing the pressure which has been applied previously to the carrier 102 and the electronic component 106. Moreover, application of a high temperature of for example 360° C. may be stopped after completing the diffusion soldering process. Thus, the package 100 comprising carrier 102 and electronic component 106 may be cooled (for example down to room temperature) following the soldering process.

During the cooling, compressive stress acts on the carrier 102 and the electronic component 106 connected therewith. This may lead to a re-warping, as shown on the right-hand side of FIG. 1 in contrast to the central drawing of FIG. 1. While the carrier 102 may be made substantially of a metal such as copper, the main material of the electronic component 106 may be silicon or another semiconductor material. Consequently, the coefficients of thermal expansion (CTE) of said materials may be extremely different. This CTE mismatch causes re-warping during cooling. However, said re-warping is of a type that it reduces the pre-warping according to the left-hand side of FIG. 1, so that at the end only a very small warpage W in the mounting plane of FIG. 1 is obtained. In FIG. 1, said warpage W may be less than 50 μm or even less than 15 μm. Referring to the image on the right-hand side of FIG. 1, said warpage W in the mounting plane may be a vertical spatial range between a lowermost bottom position of the carrier 102 at a lateral end thereof and an uppermost bottom position of the carrier 102 in a central portion thereof. The mounting plane is, referring to FIG. 1, the horizontal plane on which the carrier 102 rests.

Still referring to the image on the right-hand side of FIG. 1, ambient conditions (in particular a temperature profile and a pressure profile) are applied to the carrier 102 and to the electronic component 106 during the solder-type mounting process including post-solder cooling so that the carrier 102 is re-warped to thereby reduce warpage W of the carrier 102 in the mounting plane. As shown, the pre-shaping of the leadframe-type carrier 102 is opposite to the re-shaping of the carrier 102 together with the electronic component 106 triggered by solder heating followed by cooling. The ambient conditions applied during soldering comprise an elevated temperature followed by cooling down. The elevated temperature may be in a range from 340° C. to 380° C. Moreover, the applied ambient conditions may comprise a connection pressure for connecting the electronic component 106 with the component mounting region 104 followed by releasing said connection pressure. For example, the connection pressure may be 3.3 $N/mm^2$. Advantageously, applying said ambient conditions may re-warp the carrier 102 due to mounting so that the warpage W of the carrier 102 in the mounting plane becomes less than 50 μm. As can be taken from a comparison of the central image and the image on the right-hand side in FIG. 1, the ambient conditions are applied so that the carrier 102 is re-warped from the initial curvature direction 110 (concave on the mounting side in the shown embodiment) into an inverse final curvature direction 112 (convex on the mounting side in the shown embodiment).

As shown in a further detail 152 of the image on the right-hand side of FIG. 1, the package 100 may be formed with connection structure 126 in form of an intermetallic compound. For example, the latter may comprise AuSnCu and may connect the carrier 102 with the electronic component 106 in a reliable way. Said intermetallic connection structure 126, which may be created by the soldering process described above, may have a thickness d of several micrometers.

Figure 2:
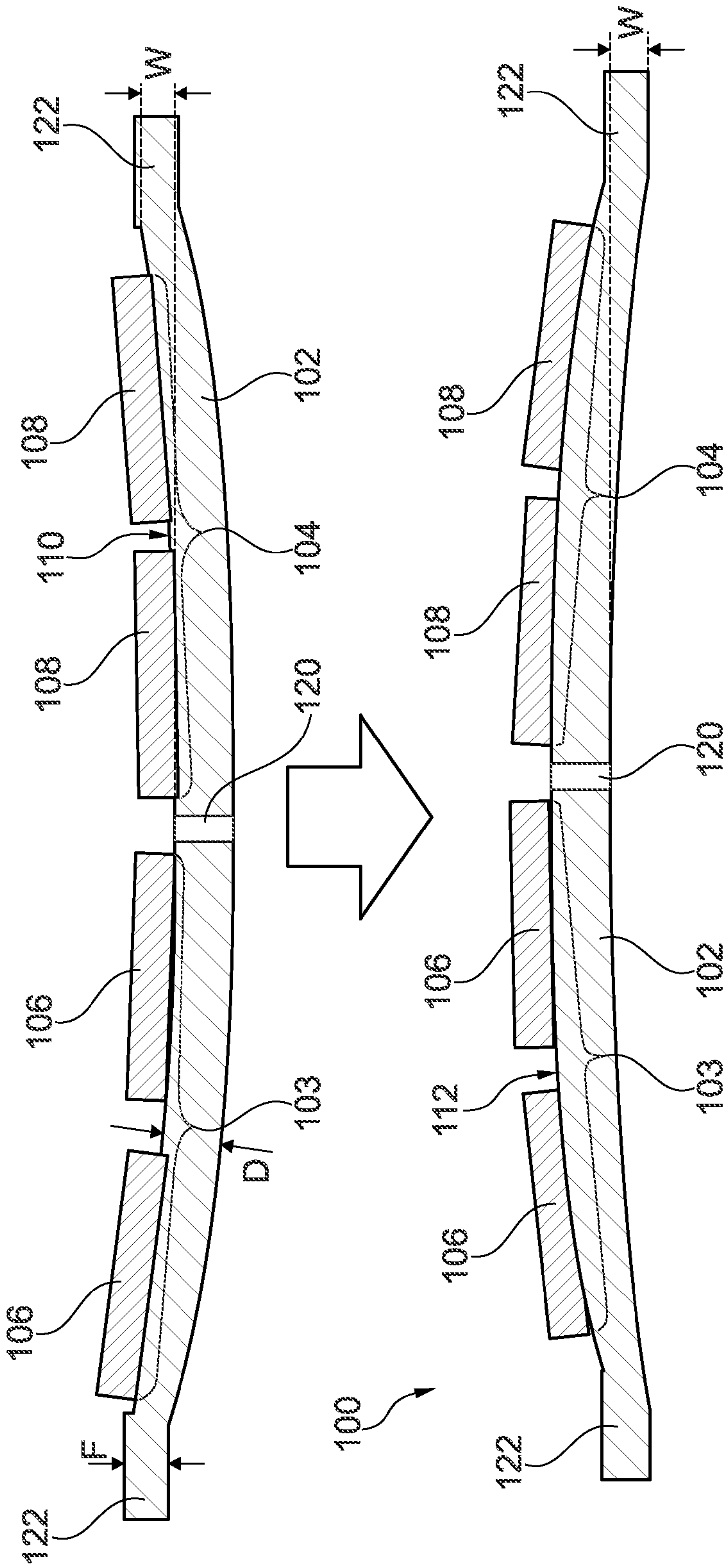
FIG. 2 illustrates cross-sectional views of structures obtained during manufacturing a package according to an exemplary embodiment.

FIG. 2 illustrates cross-sectional views of structures obtained during manufacturing a package 100 according to an exemplary embodiment.

FIG. 2 shows an embodiment similar to FIG. 1 with the difference that a plurality of electronic components 106, 108 are mounted on a plurality of component mounting regions 103, 104 on the upper main surface of the pre-warped carrier 102 shown on the top side of FIG. 2. As can be taken from FIG. 2, a slot 120 may be provided between adjacent groups of electronic components 106, 108 and between adjacent groups of component mounting regions 103, 104.

The lower image of FIG. 2 again shows that warping of the carrier 102 changes from an initial warpage direction 110 to an inverse final warpage direction 112. To put it shortly, the component mounting side of the carrier 102 is concave before soldering and is convex after soldering. However, due to the re-warping, only a small net warpage W remains, which may be 15 μm to 30 μm in the shown embodiment.

According to FIG. 2, a curvature height in a range from 15 μm to 30 μm may be obtained. A bottom heatsink (not shown) may have the same curvature as the die pad. Cooling of carrier 102 together with the mounted electronic components 106, 108 at the end of a soldering process may lead to warpage reduction or even warpage inversion due to a CTE (coefficient of thermal expansion) mismatch between the material of the carrier 102 (for instance a metal such as copper) and the material of the electronic components 106, 108 (for example predominantly a semiconductor material such as silicon). For example, the metal-based carrier 102 may be made of material having a coefficient of thermal expansion of 17 W/mK, whereas the semiconductor-based electronic components 106, 108 may be made of material having a coefficient of thermal expansion of 2 W/mK. A resulting curvature height may be less than 50 μm, for instance 15 μm to 30 μm.

Package 100 according to an exemplary embodiment shown on the bottom of FIG. 2 comprises leadframe-type carrier 102 comprising first component mounting region 103 and second component mounting region 104 with slot 120 in between. The plurality of first electronic components 106 are mounted on the first component mounting region 103. Furthermore, the plurality of second electronic components 108 are mounted on the second component mounting region 104.

The warpage W of the carrier 102 in a mounting plane (i.e. a horizontal plane according to FIG. 2 which extends into the paper plane of FIG. 2) is less than 50 μm, for instance 15 μm to 30 μm. Referring to the lower image of FIG. 2, said warpage W in the mounting plane may be a vertical spatial range between a lowermost bottom position of the carrier 102 at a lateral end thereof and an uppermost bottom position of the carrier 102 in a central portion thereof. The mounting plane is, referring to FIG. 2, the horizontal plane on which the carrier 102 rests.

Moreover, the carrier 102 comprises a plurality of lead structures 122 which may be electrically coupled with at least some of the first electronic components 106 and/or with at least some of the second electronic components 108, for instance by bond wires or clips (not shown).

A surface of the carrier 102 (preferably made of copper) may (as in FIG. 1) or may not be covered with a plating structure 124 (not shown in FIG. 2), such as nickel.

In the embodiment of FIG. 2, a thickness, D, of the carrier 102 in the first component mounting region 103 and the second component mounting region 104 may be larger than a thickness, F, of the carrier 102 in a region of lead structures 122. For example, thickness, D, may be 900 μm, whereas thickness, F, may be 500 μm.

Figure 3:
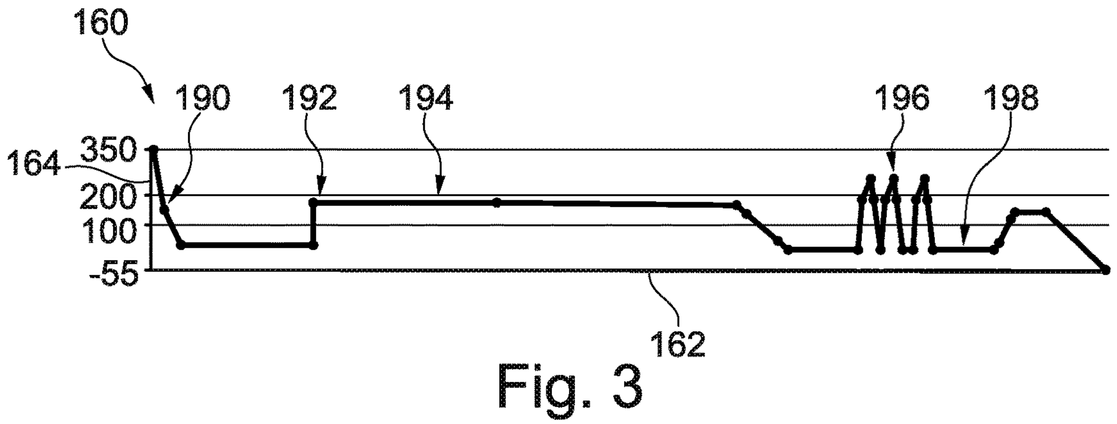
FIG. 3 and FIG. 4 illustrate diagrams indicating warpage management according to an exemplary embodiment.
Figure 4:
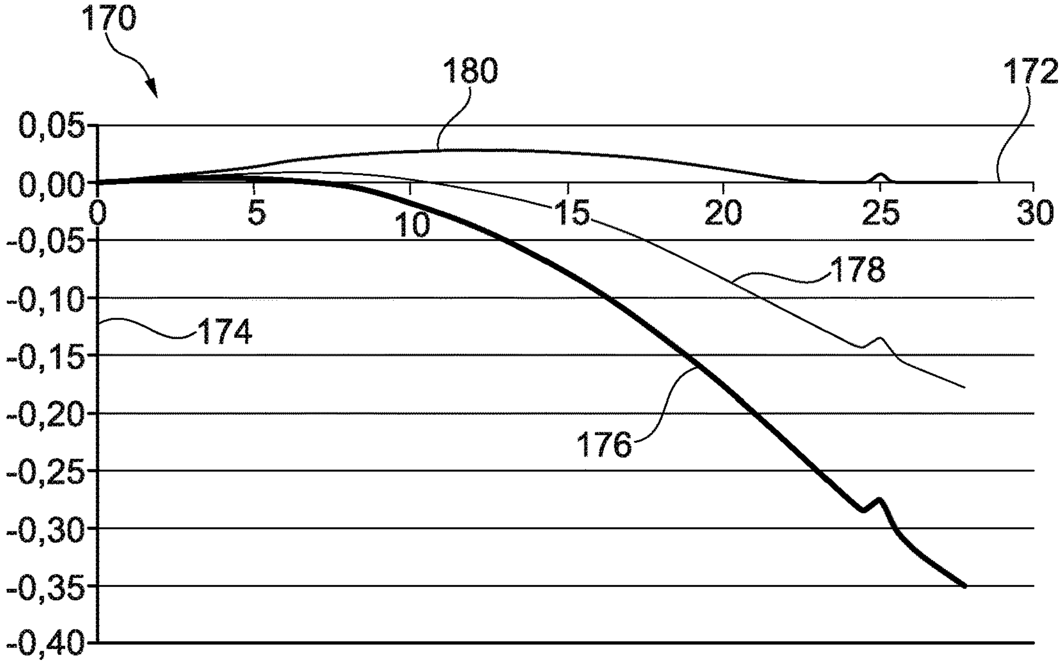

FIG. 3 and FIG. 4 illustrate diagrams 160, 170 indicating warpage management according to an exemplary embodiment.

FIG. 3 shows diagram 160 having an abscissa 162 along which the time is plotted. Along an ordinate 164, warpage W of a carrier 102 is plotted. As shown, the pre-forms of package 100 undergo different processing stages during which the warpage W is modified. In particular, warpage is changed during die attach (see reference sign 190), during encapsulating (in particular molding, see reference sign 192), during curing following encapsulating (in particular post mold curing, see reference sign 194), reflow processing (see reference sign 196, in the shown embodiment three times heat up) and in a final package (see reference sign 198).

FIG. 4 shows diagram 170 having an abscissa 172 along which the time is plotted. Along an ordinate 174, the warpage of a carrier is plotted for three different scenarios. With reference sign 176, warpage is shown in a conventional scenario in which a component mounting region of a carrier is initially convex and increases its convex characteristic during soldering. As shown with reference sign 178, a similar result is obtained in a modified conventional configuration in which an initially flat leadframe is used. With a manufacturing architecture according to an exemplary embodiment, in which a pre-warped carrier 102 is used which is re-warped during cooling following diffusion soldering, the obtained warpage is the smallest among all three scenarios, see reference sign 180.

Figure 5:
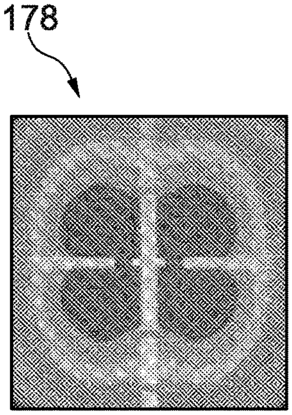
FIG. 5 to FIG. 7 illustrate simulating results indicating warpage management according to an exemplary embodiment.
Figure 6:
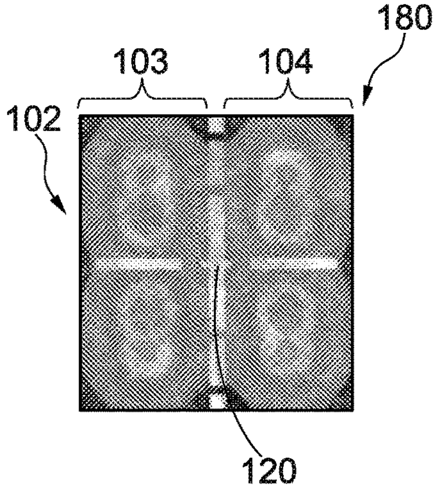
Figure 7:
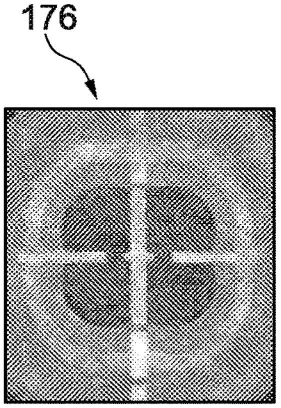

FIG. 5 to FIG. 7 illustrate simulation results indicating warpage management according to an exemplary embodiment. Thermo-mechanical simulations show that a positive warpage around +50 μm (convex shape) may completely change the warpage pattern and may reduce the package warpage from previously around 170 μm to 40 μm.

FIG. 5 shows a temperature profile obtained from a simulation of the above-mentioned second scenario, i.e. relating to the curve 178 of diagram 170. FIG. 7 shows a warpage profile obtained for the first scenario described above referring to reference sign 176. The third scenario according to the exemplary embodiment described referring to curve 180 in FIG. 4 is shown in FIG. 6.

Figure 8:
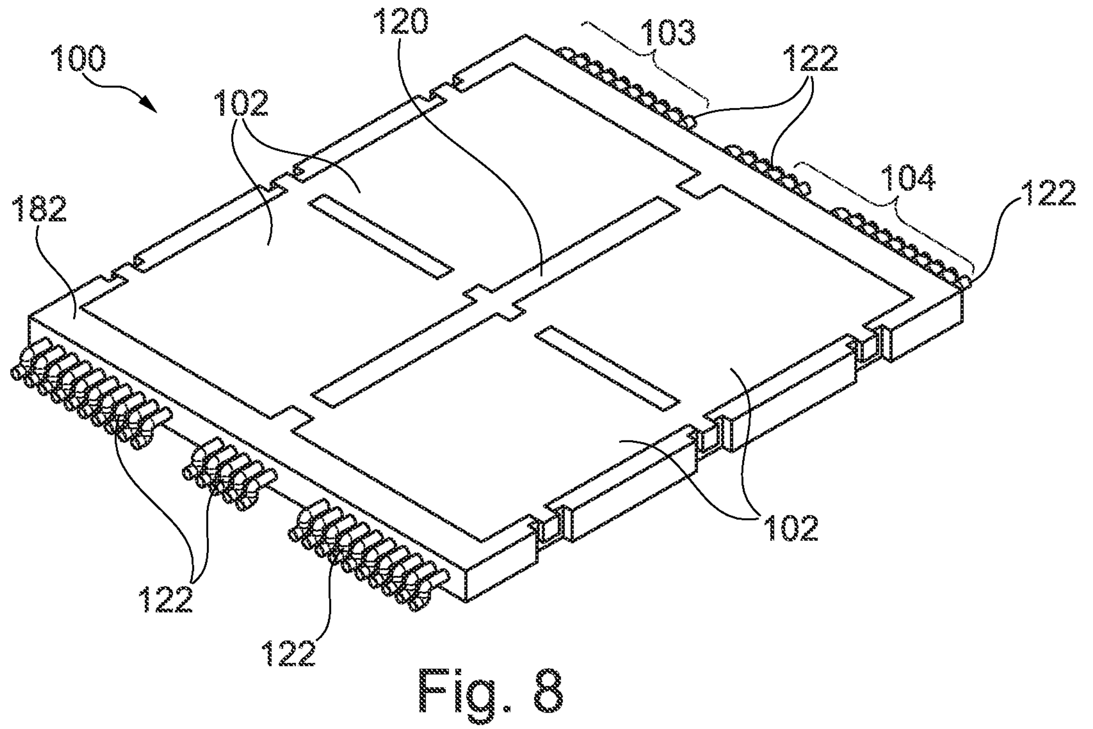
FIG. 8 illustrates a three-dimensional view of a package according to another exemplary embodiment.

FIG. 8 illustrates a three-dimensional view of a package 100 according to another exemplary embodiment.

The package 100 shown in FIG. 8 can be manufactured by a manufacturing process as the one described above referring to FIG. 1 and FIG. 2. As shown, a main surface of the carrier 102 is exposed with respect to an encapsulant 182, such as a mold compound. The exposed main surfaces of the carrier 102 may contribute significantly to cooling for removing heat generated by the electronic components 106, 108 during operation of the package 100. Leads 122 are shown which extend beyond the encapsulant 182 as well, and which may be connected to electrodes 111, 113 of the electronic components 106, 108 inside of the encapsulant 182. This may be accomplished by directly connecting part of the leads 122 to the die pad of the carrier 102 for providing a connection to the bottom-sided second electrodes 113 of the electronic components 106, 108. The top-sided first electrodes 111 of the electronic components 106, 108 may be connected by bond wires or clips (not shown) with leads 122 in an interior of the encapsulant 182.

Figure 9:
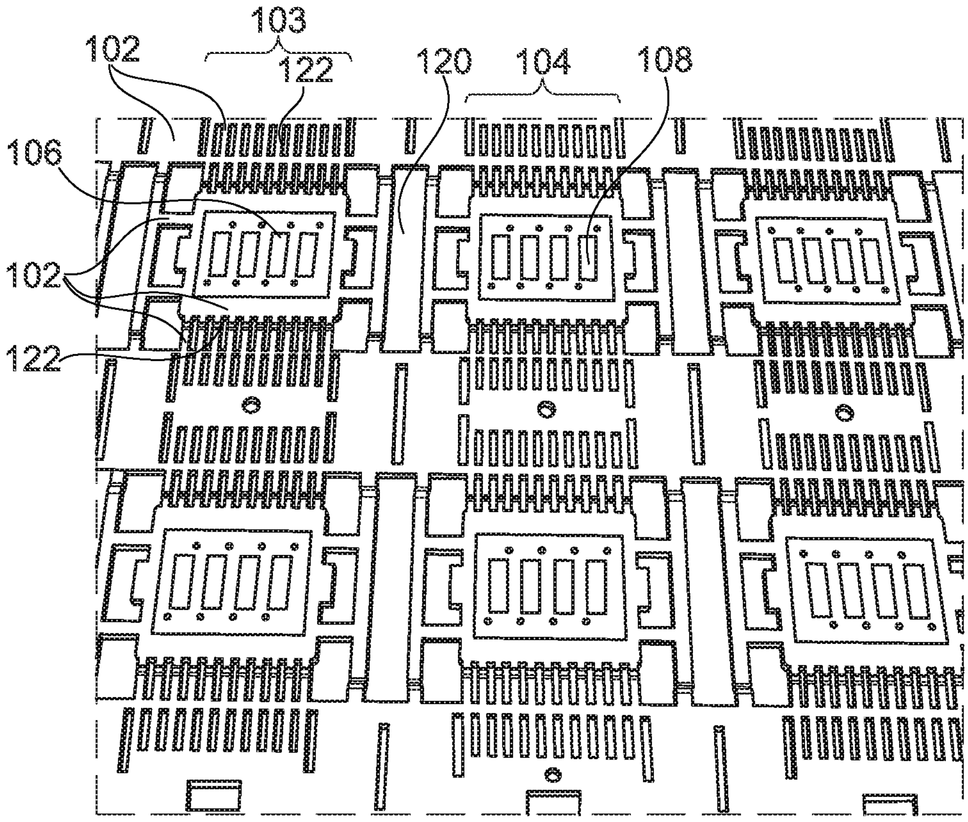
FIG. 9 illustrates a three-dimensional view of a carrier for packages according to another exemplary embodiment.

FIG. 9 illustrates a three-dimensional view of a carrier 102 for a package 100 according to another exemplary embodiment.

More specifically, FIG. 9 illustrates a lab scale leadframe for a plurality of packages 100 of the type QDPAK. Reverse bonding (i.e. converting a die pad between a convex and a concave configuration) may allow to reduce heatsink warpage after die attach. Hence, a flip of a leadframe into a heatsink up configuration may be possible. The leadframes shown in FIG. 9 are already equipped with electronic components 106, 108. Several packages 100 may be manufactured simultaneously by a common leadframe.

Figure 10:
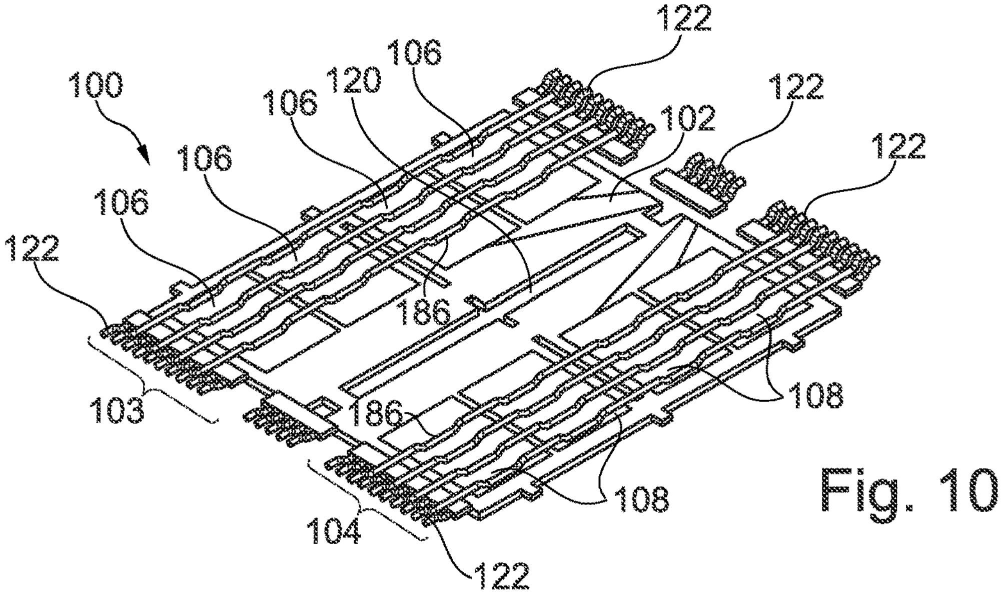
FIG. 10 to FIG. 12 illustrate three-dimensional views of packages according to another exemplary embodiment.
Figure 11:
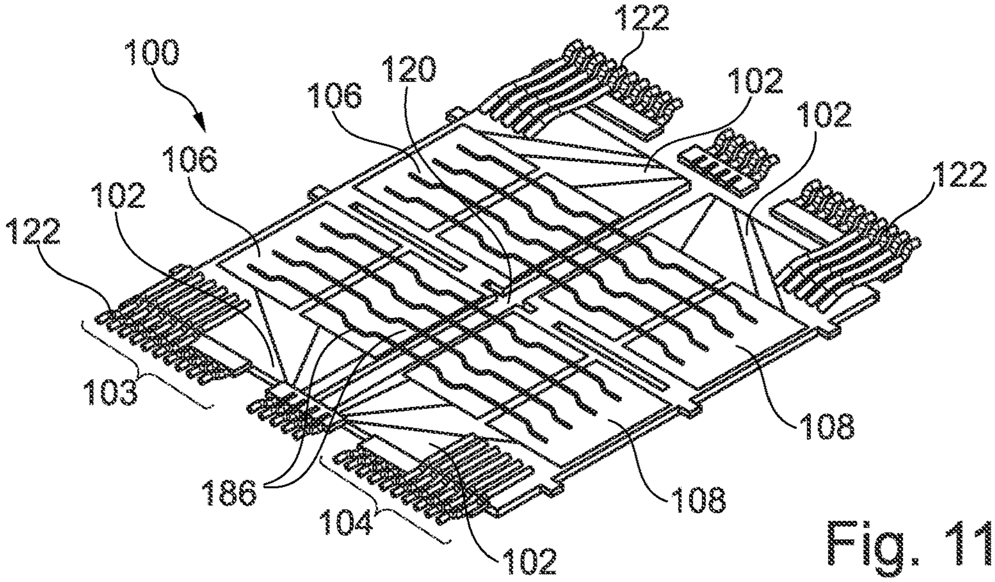
Figure 12:
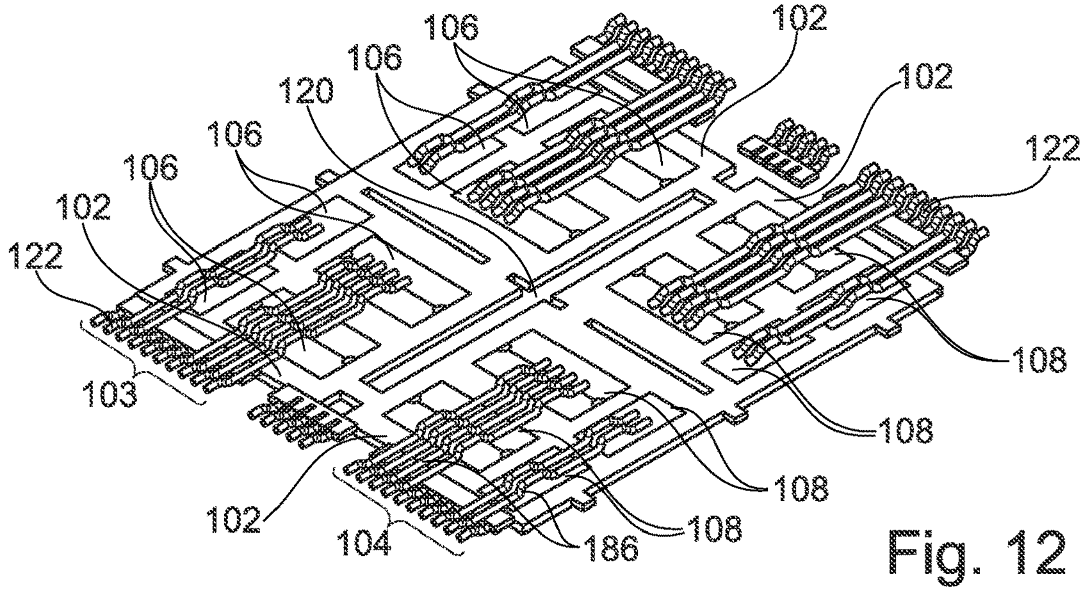

FIG. 10 to FIG. 12 illustrate three-dimensional views of packages 100 according to another exemplary embodiment. For example, eight chips or sixteen chips may form part of a single package 100. For instance, such chips may comprise an IGBT and/or a diode. A carrier 102 of a package 100 may also contribute to heat removal, i.e. cooling.

Referring to FIG. 10, a package 100 configured as monostatic switch is shown. FIG. 10 shows a leadframe-type carrier 102 with surface mounted electronic components 106, 108 and bond wires 186 connecting electrodes of the electronic components 106, 108 with leads 122 at a periphery of the carrier 102. FIG. 10 shows a corresponding package 100 before an optional encapsulation process by which encapsulant 182 protects the electrically conductive structures and mechanically protects the entire package 100.

Referring to FIG. 11, a package 100 configured as Bi-Di switch is illustrated. FIG. 11 shows another package architecture similar to the one of FIG. 10.

Referring to FIG. 12, a package 100 configured as IGBT/diode package with sixteen chips is shown. FIG. 12 shows yet another package architecture with a large number of electronic components 106, 108 mounted thereon.

Figure 15:
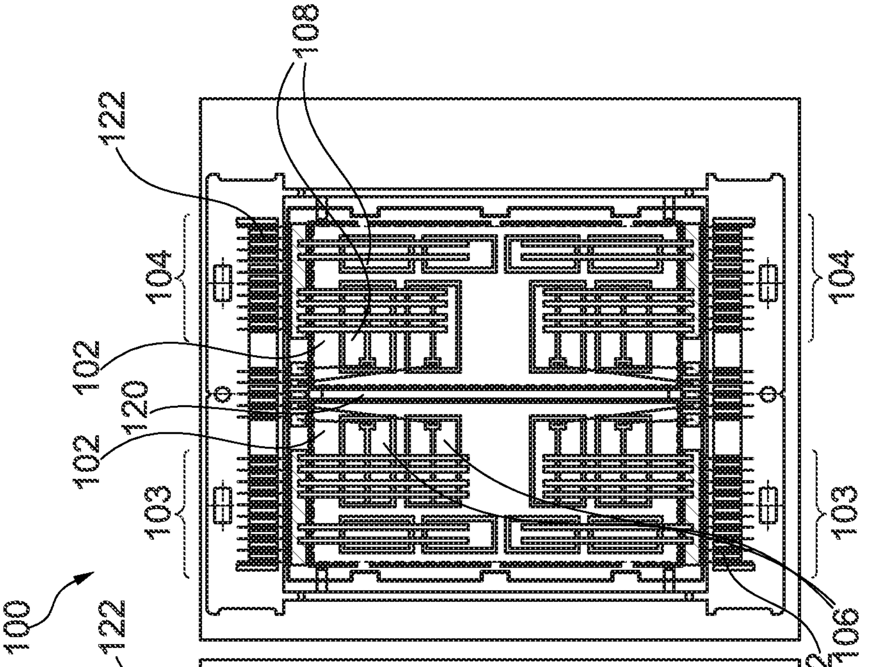
FIG. 13 to FIG. 15 illustrate plan views of packages according to another exemplary embodiment.
Figure 14:
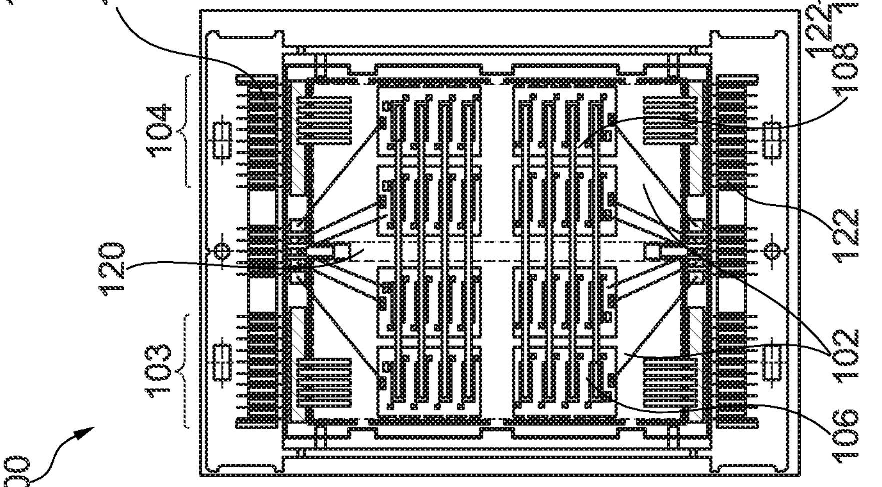
Figure 13:
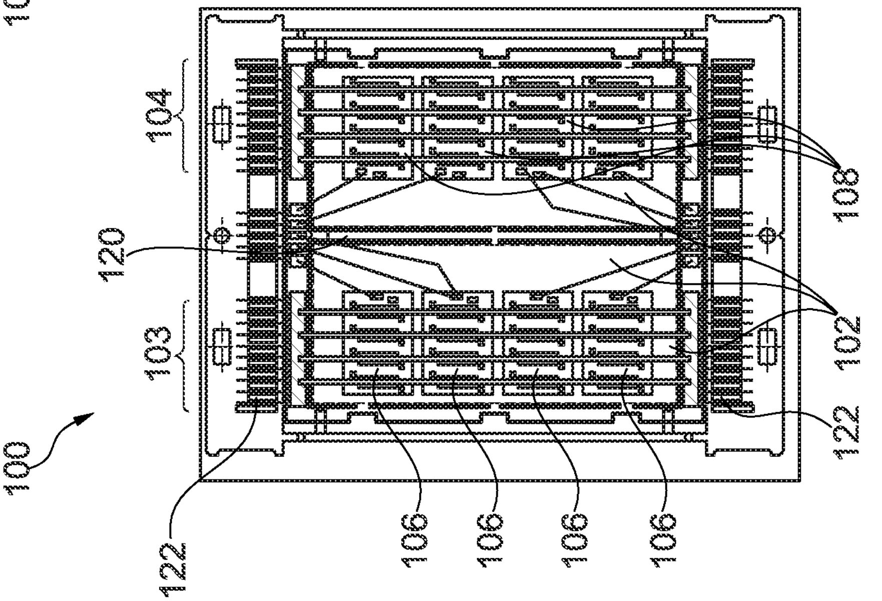

FIG. 13, FIG. 14, and FIG. 15 illustrate plan views of packages 100 according to another exemplary embodiment. In each of the structures of FIG. 13 to FIG. 15, a slot 120 divides different portions of the carrier 102. A plurality of electronic components 106, 108 are surface mounted on the carrier 102.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a package, wherein the method comprises:

providing a carrier with at least one component mounting region for mounting at least one electronic component, wherein the carrier is pre-warped in accordance with an initial curvature direction;

providing the at least one electronic component, wherein the at least one electronic component comprises at least one first electrode on a first surface and at least one second electrode on a second surface, wherein the second surface is opposite to the first surface;

mounting the at least one electronic component with the second surface on the at least one component mounting region by a solder structure; and applying ambient conditions to the carrier and to the at least one electronic component during mounting so that the carrier is re-warped to thereby at least partially reduce warpage of the carrier in a mounting plane.

2. The method according to claim 1, wherein the method comprises applying the ambient conditions to re-warp the carrier during mounting so that the warpage of the carrier in the mounting plane is in a range from 10 μm to 20 μm.

3. The method according to claim 1, comprising one of the following features:

wherein the method comprises applying the ambient conditions so that the carrier is re-warped from the initial curvature direction into an inverse final curvature direction;

wherein the method comprises applying the ambient conditions so that the carrier is re-warped to reduced warpage in the initial curvature direction;

wherein the method comprises applying the ambient conditions so that the carrier is re-warped from the initial curvature direction into a warpage-free shape.

4. The method according to claim 1, wherein the solder structure comprises at least one of the group of AuSn, NiSn and/or CuSn, and InSn.

5. The method according to claim 1, wherein the solder structure is disposed on the second electrode on the second surface of the at least one electronic component.

6. The method according to claim 1, wherein a thickness of the solder structure is in a range from 1 μm to 10 μm.

7. The method according to claim 1, wherein the method comprises mounting the at least one electronic component on the at least one component mounting region by diffusion soldering.

8. The method according to claim 1, wherein the initial curvature direction corresponds to a concave mounting surface of the at least one component mounting region on which mounting surface the at least one electronic component is mounted.

9. The method according to claim 1, wherein the applied ambient conditions comprise an elevated temperature followed by cooling down.

10. The method according to claim 9, wherein the elevated temperature is in a range from 300° C. to 400° C.

11. The method according to claim 1, wherein the applied ambient conditions comprise a connection pressure for connecting the at least one electronic component with the at least one component mounting region followed by releasing said connection pressure.

12. The method according to claim 11, wherein the connection pressure is at least 1 $N/mm^2$.

13. The method according to claim 1, wherein the method comprises mounting the at least one electronic component on the at least one component mounting region by pressing the at least one electronic component by a bond tool onto the at least one component mounting region, wherein in particular a surface of the bond tool pressing the at least one electronic component on the at least one component mounting region is curved in accordance with a bond tool curvature direction being inverse to the initial curvature direction of the carrier.

14. The method according to claim 1, wherein the method comprises mounting at least one further electronic component on the at least one component mounting region.

15. A package, comprising:

a carrier comprising a first component mounting region and a second component mounting region with a slot in between extending through the carrier;

at least one first electronic component mounted on the first component mounting region; and at least one second electronic component mounted on the second component mounting region;

wherein warpage of the carrier in a mounting plane is less than 50 μm.

16. The package according to claim 15, comprising at least one of the following features:

wherein the warpage of the carrier in the mounting plane is less than 15 μm, in particular less than 10 μm;

wherein the carrier comprises a leadframe structure;

wherein the carrier comprises a plurality of lead structures, in particular electrically coupled with at least one of the at least one first electronic component, the at least one second electronic component, the first component mounting region and the second component mounting region.

17. The package according to claim 15, wherein at least part of a surface of the carrier is covered with a plating structure, in particular at least one of the group consisting of nickel, silver, and NiNiP.

18. The package according to claim 15, wherein a thickness of at least one of the first component mounting region and the second component mounting region is in a range from 0.2 mm to 1.5 mm.

19. The package according to claim 15, comprising a connection structure in form of an intermetallic compound, in particular at least one of the group of AuSnCu, AuSnNi, AuSnAg, NiSn and CuSn, connecting the carrier with at least one of the at least one first electronic component and the at least one second electronic component.

20. The package according to claim 19, wherein the connection structure has a thickness in a range from 1 μm to 10 μm.

* * * * *